(12) United States Patent
Kamiya

(10) Patent No.: US 6,215,347 B1
(45) Date of Patent: Apr. 10, 2001

(54) UNDERSHOOT/OVERSHOOT PROTECTING CIRCUIT

(75) Inventor: Hiroshi Kamiya, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/177,968

(22) Filed: Oct. 26, 1998

(30) Foreign Application Priority Data

Oct. 28, 1997 (JP) .................................................. 9-295394

(51) Int. Cl.⁷ .................................................. H03K 17/30
(52) U.S. Cl. ........................... 327/379; 327/310; 327/311
(58) Field of Search .................................. 327/78, 80, 68, 327/69, 335, 379, 551, 310, 311, 312, 315, 316, 321, 323, 387; 326/26; 361/90, 91.1, 92

(56) References Cited

U.S. PATENT DOCUMENTS 4,532,475 * 7/1985 Ishigaki et al. .......................... 327/33
5,952,736 * 9/1999 Matsubara .............................. 307/106

FOREIGN PATENT DOCUMENTS

| 57-203122 | 12/1982 | (JP) . |
| 6-35582 | 2/1994 | (JP) . |
| 7-334281 | 12/1995 | (JP) . |

* cited by examiner

Primary Examiner—Tuan T. Lam
Assistant Examiner—Hiep Nguyen
(74) Attorney, Agent, or Firm—Sughrue, Mion, Zinn, Macpeak & Seas, PLLC

(57) ABSTRACT

After an output signal is inverted by an inverter circuit, the resultant signal is differentiated by a differentiating circuit. The connecting states of selectors are changed so that only when the signal level of the differentiated output exceeds a predetermined threshold value, the output signal is sent through a resistor. After the output signal is buffered by a buffering circuit, the resultant signal is differentiated by a differentiating circuit. The connecting states of selectors are changed so that only when the signal level of the differentiated output exceeds a predetermined threshold value, the output signal is sent through a resistor.

26 Claims, 2 Drawing Sheets

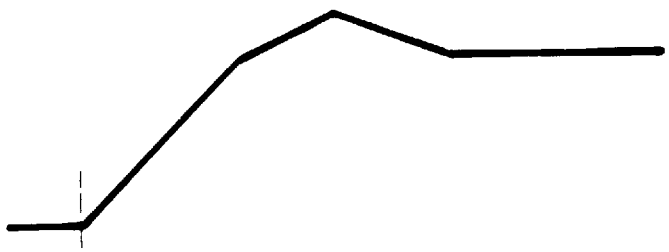
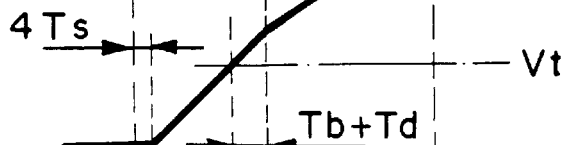
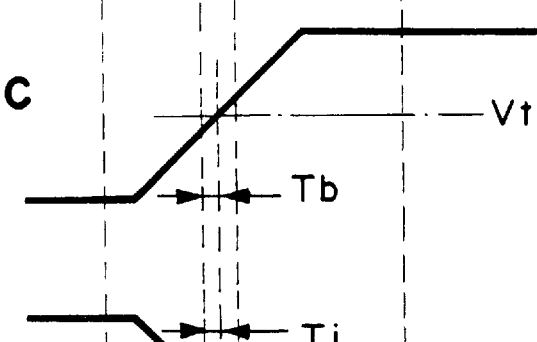
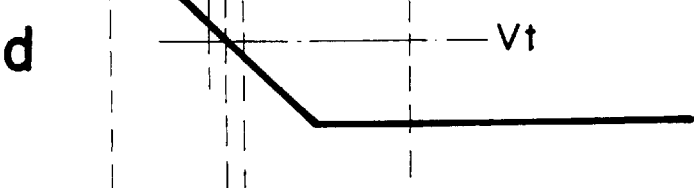
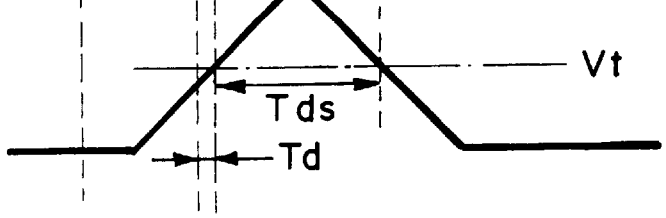

UNDERSHOOT/OVERSHOOT PROTECTING CIRCUIT

BACKGROUND OF THE INVENTION

1. Field of the Invention

The present invention relates to an undershoot/overshoot protecting circuit, in particular, to an undershoot/overshoot a protecting circuit for removing a noise of a waveform inputting circuit.

2. Description of the Related Art

Generally, crosstalk takes place due to stray coupling of adjacent signals. The crosstalk results in noise of a waveform. The amount of noise varies depending on the level of the waveform and the amount of overshoot or undershoot. Thus, to suppress noise caused by crosstalk, overshoot and/or undershoot should be prevented.

In a waveform inputting circuit for use with an LSI (Large Scale Integrated circuit), to prevent overshoot and/or undershoot from taking place, a clamp diode has been used.

However, in the conventional circuit using such a clamp diode, the through rate of the input waveform cannot be adjusted. Thus, when a waveform with a sharp leading/ trailing edge is input, crosstalk takes place between leads of the LSI.

As described in Japanese Patent Laid-open Publication No. Hei6-35582, ringing tends to take place in a high speed bus. So far, the drawback of the above related art has not been solved.

SUMMARY OF THE INVENTION

The present invention is made from the above-described point of view. An object of the present invention is to provide an undershoot/overshoot protecting circuit that adjusts the through rate of an input waveform and prevents crosstalk from taking place between leads of an LSI against a waveform having a sharp leading/trailing edge without an increase of delay time.

A first aspect of the present invention is an undershoot protecting circuit, comprising an inverter circuit for inverting an output signal, a differentiating circuit for differentiating the output signal of the inverter circuit, an undershoot suppressing device for suppressing undershoot of the output signal, and a switching circuit for changing the connecting state of an output signal line so that only when the differentiated output signal of the differentiating circuit exceeds a predetermined threshold level, the output signal is sent through the undershoot suppressing device.

A second aspect of the present invention is an overshoot protecting circuit, comprising a buffering circuit for buffering an output signal, a differentiating circuit for differentiating an output of the buffering circuit, an overshoot suppressing device for suppressing overshoot of the output signal, and a switching circuit for selecting a connecting state of an output signal line so that only when the signal level of the differentiated output signal exceeds a predetermined threshold value, the output signal is sent through the overshoot suppressing device.

The undershoot/overshoot protecting circuit according to the present invention prevents undershoot and/or overshoot from taking place. In addition, the time period until the signal level of the waveform becomes a predetermined threshold level does not vary. Thus, the undershoot/ overshoot protecting circuit can suppress crosstalk noise from taking place without an increase of delay time.

These and other objects, features and advantages of the present invention will become more apparent in light of the following detailed description of a best mode embodiment thereof, as illustrated in the accompanying drawings.

BRIEF DESCRIPTION OF DRAWINGS

FIGS. 2a to 2f are schematic diagrams showing the operations of individual portions of the undershoot/ overshoot protecting circuit shown in FIG. 1.

DESCRIPTION OF PREFERRED EMBODIMENT

Next, with reference to the accompanying drawings, an embodiment of the present invention will be described.

Figure 1:
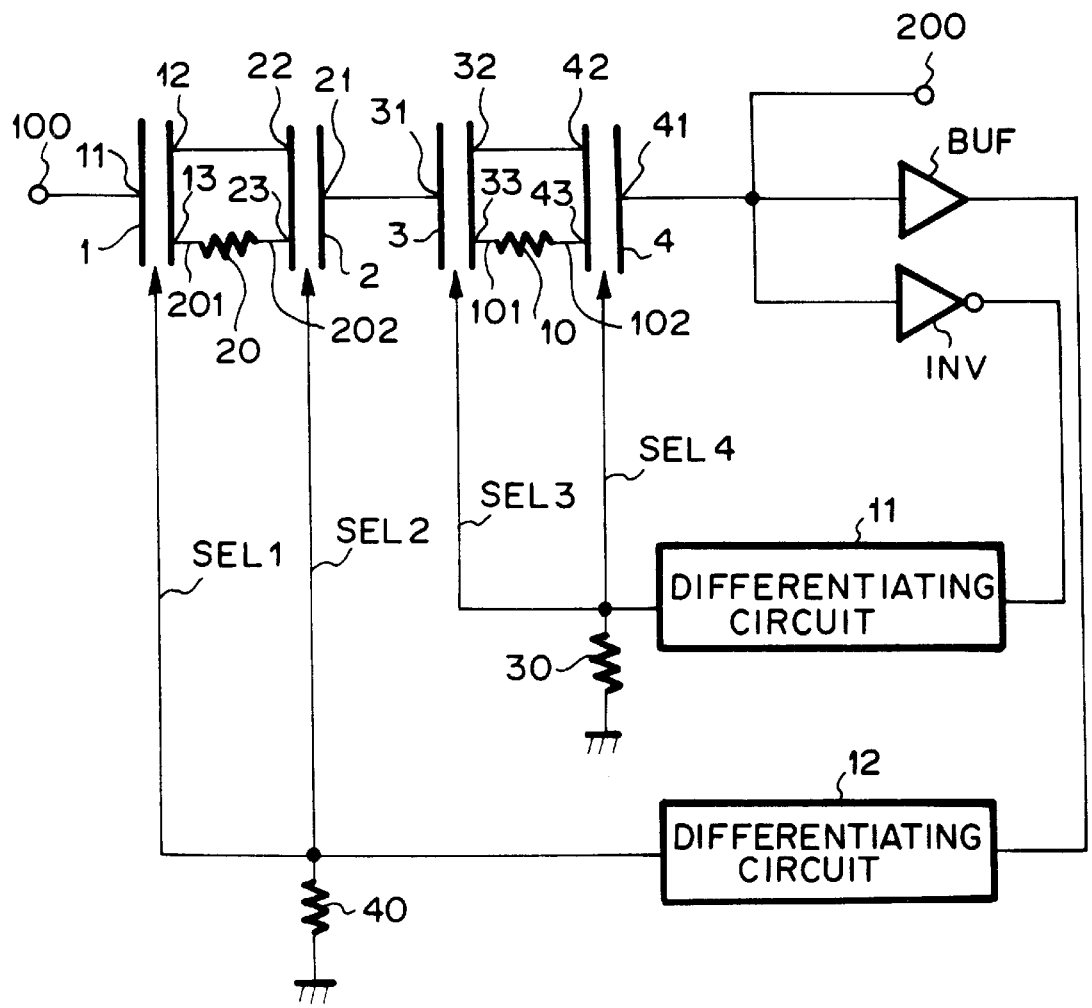
FIG. 1 is a block diagram showing the structure of an undershoot/overshoot protecting circuit according to an embodiment of the present invention.

FIG. 1 is a block diagram showing the structure of an undershoot/overshoot protecting circuit according to an embodiment of the present invention. In FIG. 1, an input terminal 100 is connected to a terminal 11 of a selector 1. A terminal 12 of the selector 1 is connected to a terminal 22 of a selector 2.

A terminal 13 of the selector 1 is connected to a terminal 201 of a resistor 20. A terminal 202 of the resistor 20 is connected to a terminal 23 of the selector 2. A terminal 21 of the selector 2 is connected to a terminal 31 of a selector 3. A terminal 32 of the selector 3 is connected to a terminal 42 of a selector 4. The selectors 1 to 4 are switches that change the connection states corresponding to respective control signals. Each of the selectors is composed of for example two MOS FETs. The inputs of the MOS FETs are common. A control signal is directly supplied to the control gate of one MOS FET. In addition, the control signal is supplied to the control gate of the other MOS FET through an inverter. The input signal is output from one of the two MOS FETs corresponding to the control signal.

A terminal 33 of the selector 3 is connected to a terminal 101 of a resistor 10. A terminal 102 of the resistor 10 is connected to a terminal 43 of a selector 4.

A terminal 41 of the selector 4 is connected to a waveform input portion 200, an input portion of a buffering circuit BUF, and an input portion of an inverter circuit INV.

An output portion of the buffering circuit BUF is connected to an input portion of a differentiating circuit 12. An output portion of the differentiating circuit 12 is connected to one terminal of a pull down resistor 40. An output signal of the differentiating circuit 12 becomes a selector signal SEL1 of the selector 1 and a selector signal SEL2 of the selector 2. The other terminal of the pull down resistor 40 is connected to the ground.

An output portion of the inverter circuit INV is connected to an input portion of a differentiating circuit 11. An output portion of the differentiating circuit 11 is connected to one terminal of a pull down resistor 30. An output signal of the differentiating circuit 11 becomes a selector signal SEL3 of the selector 3 and a selector signal SEL4 of the selector 4. The other terminal of the pull down resistor 30 is connected to the ground.

In this example, the delay time of the selectors 1 to 4 is represented by Ts. The delay time of the gate of the buffering circuit BUF is represented by Tb. The delay time of the gate of the inverter circuit INV is represented by Ti. The delay time of the differentiating circuits 11 and 12 is represented by Td. The threshold voltage of the buffering circuit BUF, the inverter circuit INV, and the selector signals SEL1 to SEL4 is represented by Vt. In this case, it is assumed that a waveform with a large amount of overshoot is input to the input terminal as shown in FIG. 2a.

At this point, the output portion of the differentiating circuit 11 is connected to the ground through the pull down resistor 30. Thus, the signal level of the output portion of the differentiating circuit 11 is low. In addition, the output portion of the differentiating circuit 12 is connected to the ground through the pull down resistor 40. Thus, the signal level of the output portion of the differentiating circuit 12 is low. Consequently, the signal levels of the selector signal SEL1 of the selector 1, the selector signal SEL2 of the selector 2, the selector signal SEL3 of the selector 3, and the selector signal SEL4 of the selector 4 are low. At this point, the waveform at the terminal 11 of the selector 1 passes through the terminal 12 of the selector 1, the terminals 22 and 21 of the selector 2, the terminals 31 and 32 of the selector 3, and the terminals 42 and 41 of the selector 4. Thus, a waveform as shown in FIG. 2b is input to the waveform input portion 200, the input portion of the buffering circuit BUF, and the input portion of the inverter circuit INV.

The waveform that is output from the output portion of the buffering circuit BUF is input to the input portion of the differentiating circuit 12. The waveform at the input portion of 10. The differentiating circuit 12 is as shown in FIG. 2c. In addition, the waveform that is output from the output portion of the inverter circuit INV is input to the input portion of the differentiating circuit 11. The waveform at the input portion of the differentiating circuit 11 is as shown in FIG. 2d.

At this point, the waveform at the output portion of the differentiating circuit 11 is as shown in FIG. 2e. The waveform is input to the selectors 3 and 4 as the selector signals SEL3 and SEL4, respectively. In this case, since the signal level of the waveform does not exceed the threshold voltage Vt, the selecting states of the selectors 3 and 4 do not vary.

The waveform at the output portion of the differentiating circuit 12 is as shown in FIG. 2f. The waveform at the output portion of the differentiating circuit 12 is input to the selectors 1 and 2 as the selector signals SEL1 and SEL2, respectively. In this case, the signal level of the waveform exceeds the threshold voltage Vt for a time period Tds. Thus, the selecting state of the selector 1 is changed from the terminal 12 to the terminal 13 for the time period Tds. In addition, the selecting state of the selector 2 is changed from the terminal 22 to the terminal 23.

Until the waveform is input to the selector 2 through the selector 1 (namely, while the terminal 13 of the selector 1 and the terminal 23 of the selector 2 are being selected), the resistor 20 causes the waveform to be dull. Thus, a waveform having a resistance against crosstalk noise is input to the waveform input portion 200.

When a waveform with a trailing edge having a large amount of undershoot is input to the input terminal, likewise, the time period of the trailing edge becomes long. Thus, a waveform having a resistance against crosstalk noise is input to the waveform input portion 200.

Figure 3:
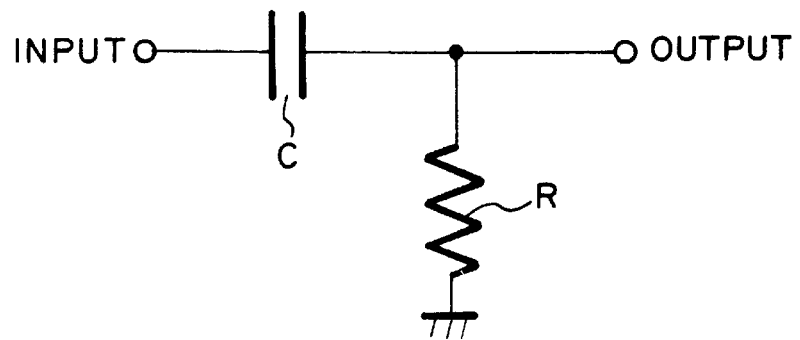
FIG. 3 is a schematic diagram showing an example of the internal structure of a differentiating circuit of the undershoot/overshoot protecting circuit shown in FIG. 1.

Each of the differentiating circuits 11 and 12 shown in FIG. 1 is composed of a capacitor C and a resistor R as shown in FIG. 3. The capacitor C is connected in series to the signal line between the input portion and the output portion. The resistor R is connected between the signal line and the ground. Thus, the differentiating circuits 11 and 12 can be composed of known differentiating circuits. When time constants of the differentiating circuits 11 and 12 are properly selected, the waveforms as shown in FIGS. 2e and 2f can be obtained.

With only the buffering circuit BUF, the differentiating circuit 12, the selectors 1 and 2, and the resistor 20, it is clear that at least overshoot can be prevented. Likewise, with only the inverter circuit INV, the differentiating circuit 11, the selectors 3 and 4, and the resistor 10, it is clear that at least undershoot can be prevented.

In the above-described embodiment, the undershoot/ overshoot protecting circuit for use with an LSI was described. However, it should be noted that the undershoot/ overshoot protecting circuit can be applied to other than an LSI.

As described above, since undershoot and/or overshoot can be prevented without varying a time period until the signal level of a waveform becomes a threshold level, crosstalk noise can be suppressed without an increase of delay time.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. An undershoot protecting circuit, comprising:

an inverter circuit for inverting an input signal that is at least indirectly supplied to an output signal line;

a differentiating circuit coupled to said inverter circuit for differentiating an output signal of said inverter circuit;

an undershoot suppressing device coupled to said inverter circuit for suppressing undershoot of the input signal before the input signal is at least indirectly supplied to the output signal line; and a switching circuit for changing a connecting state of the output signal line so that only when a differentiated output of said differentiating circuit exceeds a predetermined threshold level, the input signal is sent through said undershoot suppressing device.

2. The undershoot protecting circuit as set forth in claim 1, wherein said undershoot suppressing device is a resistor connected to the output signal line in series.

3. The undershoot protecting circuit as set forth in claim 1, wherein said switching circuit is a selector that selects one of the connecting state of the output signal line in which said undershoot suppressing device is electronically connected to the output signal line and a non-connecting state of the output signal line in which said undershoot suppressing device is not electrically connected to the output signal line, wherein said selector selects one of the connecting state and the non-connecting state based on a signal level of the differentiated output.

4. The undershoot protecting circuit as set forth in claim 1, wherein said differentiating circuit has a capacitor and a resistor, the capacitor being connected to the output signal line of said inverter circuit in series, the resistor being connected between the output signal line and the ground.

5. The undershoot protecting circuit as set forth in claim 2,
   wherein said switching circuit is a selector that selects one of a connecting state of the output signal line in which said undershoot suppressing device is electrically connected to the output signal line and a non-connecting state of the output signal line in which said undershoot suppressing device is not electrically connected to the output signal line, wherein said selector selects one of the connecting state and the non-connecting state based on a signal level of the differentiated output.

6. The undershoot protecting circuit as set forth in claim 2,
   wherein said differentiating circuit has a capacitor and a resistor, the capacitor being connected to the output signal line of said inverter circuit in series, the resistor being connected between the output signal line and the ground.

7. An overshoot protecting circuit, comprising:
   a buffering circuit for buffering an input signal that is at least indirectly supplied to an output signal line;
   a differentiating circuit coupled to said buffering circuit for differentiating an output signal of said buffering circuit;
   an overshoot suppressing device coupled to said buffering circuit for suppressing overshoot of the output signal before the input signal is supplied to the output signal line; and
   a switching circuit for selecting a connecting state of the output signal line so that only when a signal level of a differentiated output of said differentiating circuit exceeds a predetermined threshold value, the input signal is sent through said overshoot suppressing device.

8. The overshoot protecting circuit as set forth in claim 7,
   wherein said overshoot suppressing device is a resistor connected to the output signal line in series.

9. The overshoot protecting circuit as set forth in claim 7,
   wherein said switching circuit is a selector that selects one of the connecting state of the output signal line in which said overshoot suppressing device is electrically connected to the output signal line and a non-connecting state of the output signal line in which said overshoot suppressing device is not electrically connected to the output signal line, wherein said selector selects one of the connecting state and the non-connecting states based on the signal level of the differentiated output.

10. The overshoot protecting circuit as set forth in claim 7,
    wherein said differentiating circuit has a capacitor and a resistor, the capacitor being connected to the output signal line of said buffering circuit in series, the resistor being connected between the output signal line and the ground.

11. The overshoot protecting circuit as set forth in claim 8,
    wherein said switching circuit is a selector that selects one of the connecting state of the output signal line in which said overshoot suppressing device is electrically connected to the output signal line and a non-connecting state of the output signal line in which said overshoot suppressing device is not electrically connected to the output signal line, wherein said selector selects one of the connecting state and the non-connecting state based on the signal level of the differentiated output.

12. The overshoot protecting circuit as set forth in claim 8,
    wherein said differentiating circuit has a capacitor and a resistor, the capacitor being connected to the output signal line of said buffering circuit in series, the resistor being connected between the output signal line and the ground.

13. An undershoot/overshoot protecting circuit, comprising:
    an inverter circuit for inverting an input signal that is at least indirectly supplied to an output signal line;
    a first differentiating circuit coupled to said inverter circuit for differentiating an inverter output signal of said inverter circuit;
    an undershoot suppressing device coupled to said inverter circuit for suppressing undershoot of the input signal before the input signal is at least indirectly supplied to the output signal line;
    a first switching circuit for changing a connecting state of the output signal line so that only when a differentiated output signal of said first differentiating circuit exceeds a predetermined threshold level, the input signal is sent through said undershoot suppressing device;
    a buffering circuit for buffering the input signal;
    a second differentiating circuit coupled to said buffering circuit for differentiating a buffered output signal of said buffering circuit;
    an overshoot suppressing device coupled to said buffering circuit for suppressing overshoot of the input signal before the input signal is at least indirectly supplied to the output signal line; and
    a second switching circuit for selecting the connecting state of the output signal line so that only when signal level of a differentiated output of the second differentiating circuit exceeds predetermined threshold value, the input signal is sent through said overshoot suppressing device.

14. The undershoot/overshoot protecting circuit as set forth in claim 13,
    wherein said undershoot suppressing device is a resistor connected to the output signal line in series.

15. The undershoot/overshoot protecting circuit as set forth in claim 13,
    wherein said first switching circuit is a selector that selects one of the connecting state of the output signal line in which said undershoot suppressing device is electrically connected to the output signal line and a non-connecting state of the output signal line in which said undershoot suppressing device is not electrically connected to the output signal line, wherein the selector selects one of the connecting state and the non-connecting state based on the signal level of the differentiated output of said first differentiating circuit.

16. The undershoot/overshoot protecting circuit as set forth in claim 13,
    wherein said overshoot suppressing device is a resistor connected to the output signal line in series.

17. The undershoot/overshoot protecting circuit as set forth in claim 13,
    wherein said second switching circuit is a selector that selects one of the connecting state of the output signal line in which said overshoot suppressing device is electrically connected to the output signal line and a non-connecting state of the output signal line in which said overshoot suppressing device is not electrically connected to the output signal line, wherein said selector selects one of the connecting state and the non-connecting state based on the signal level of the differentiated output of said second differentiating circuit.

18. A protecting circuit, comprising:

an input terminal that receives an input signal;

a first selector circuit that receives the input signal and outputs the input signal as an output signal via an output terminal;

a first signal suppressing circuit that suppresses a first signal characteristic in said input signal; and a first differentiator circuit that differentiates the output signal and generates a corresponding first differentiated signal, wherein said first selector circuit selectively couples the input signal to said output terminal via a first signal supply path or a second signal supply path based on a signal level of said first differentiated signal, and wherein said first signal suppressing circuit is contained in said first signal supply path and is not contained in said second signal supply path.

19. The protecting circuit as claimed in claim 18, wherein said first differentiator circuit comprises:

an inverter circuit that inputs said output signal and outputs a corresponding inverted signal; and a first differentiating circuit that differentiates said inverted signal to produce said first differentiated signal.

20. The protecting circuit as claimed in claim 18, wherein said first signal characteristic is an undershoot characteristic.

21. The protecting circuit as claimed in claim 18, wherein said first differentiator circuit comprises:

a buffer circuit that inputs said output signal and outputs a corresponding buffered signal; and a first differentiating circuit that differentiates said buffered signal to produce said first differentiated signal.

22. The protecting circuit as claimed in claim 18, wherein said first signal characteristic is an overshoot characteristic.

23. The protecting circuit as claimed in claim 18, further comprising;

a second selector circuit that receives the input signal and outputs the input signal as an output signal via said output terminal;

a second signal suppressing circuit that suppresses a second signal characteristic in said input signal; and a second differentiator circuit that differentiates said output signal and generates a corresponding second differentiated signal, wherein said second selector circuit selectively couples the input signal to said output terminal via a third signal supply path or a fourth signal supply path based on a signal level of said second differentiated signal, and wherein said second signal suppressing circuit is contained in said third signal supply path and is not contained in said fourth signal supply path.

24. The protecting circuit as claimed in claim 23, wherein said first differentiator circuit comprises:

an inverter circuit that inputs said output signal and outputs a corresponding inverted signal; and a first differentiating circuit that differentiates said inverted signal to produce said first differentiated signal.

25. The protecting circuit as claimed in claim 24, wherein said second differentiator circuit comprises:

a buffer circuit that inputs said output signal and outputs a corresponding buffered signal; and a second differentiating circuit that differentiates said buffered signal to produce said second differentiated signal.

26. The protecting circuit as claimed in claim 25, wherein said first signal characteristic is an undershoot characteristic and wherein said second signal characteristic is an overshoot characteristic.

* * * * *